(12) United States Patent
Kim

(10) Patent No.: US 11,251,167 B2
(45) Date of Patent: Feb. 15, 2022

(54) MULTI-JUNCTION LED WITH EUTECTIC BONDING AND METHOD OF MANUFACTURING THE SAME

(71) Applicant: SUNDIODE KOREA, Gwangju (KR)

(72) Inventor: James Chinmo Kim, San Jose, CA (US)

(73) Assignee: SUNDIODE KOREA

( * ) Notice: Subject to any disclaimer, the term of this patent is extended or adjusted under 35 U.S.C. 154(b) by 55 days.

(21) Appl. No.: 16/578,258

(22) Filed: Sep. 20, 2019

(65) Prior Publication Data

US 2020/0402964 A1    Dec. 24, 2020

(30) Foreign Application Priority Data

Jun. 24, 2019 (KR) ........................ 10-2019-0075076

(51) Int. Cl.
| | |
|---|---|
| *H01L 25/075* | (2006.01) |
| *H01L 23/00* | (2006.01) |
| *H01L 33/06* | (2010.01) |
| *H01L 33/14* | (2010.01) |
| *H01L 33/24* | (2010.01) |
| *H01L 33/40* | (2010.01) |

(Continued)

(52) U.S. Cl.
CPC ............ *H01L 25/0756* (2013.01); *C22C 5/02* (2013.01); *H01L 24/32* (2013.01); *H01L 24/83* (2013.01); *H01L 33/06* (2013.01); *H01L 33/14* (2013.01); *H01L 33/24* (2013.01); *H01L 33/405* (2013.01); *H01L 33/44* (2013.01); *H01L 33/62* (2013.01); *H01L 2224/32145* (2013.01); *H01L 2224/32502* (2013.01); *H01L 2224/83805* (2013.01); *H01L 2924/0105* (2013.01); *H01L 2924/01032* (2013.01); *H01L 2924/01079* (2013.01); *H01L 2924/01322* (2013.01); *H01L 2933/0016* (2013.01); *H01L 2933/0025* (2013.01); *H01L 2933/0066* (2013.01)

(58) Field of Classification Search
CPC ..... H01L 25/0756; H01L 24/32; H01L 24/83; H01L 33/06; H01L 33/14; H01L 33/24; H01L 33/405; H01L 33/44; H01L 33/62
See application file for complete search history.

(56) References Cited

U.S. PATENT DOCUMENTS

| | | | |
|---|---|---|---|
| 2012/0061691 A1* | 3/2012 | Chen ..................... | H01L 27/156 257/88 |
| 2014/0139294 A1* | 5/2014 | Harasaka ............... | H03B 17/00 331/1 R |

(Continued)

*Primary Examiner* — Christine A Enad
(74) *Attorney, Agent, or Firm* — Renaissance IP Law Group LLP

(57) ABSTRACT

Disclosed are multi-junction light emitting diode (LED) formed by using eutectic bonding and method of manufacturing the multi-junction LED. The multi-junction LED is formed by stacking a separately formed light emitting structure on another light emitting structure by using eutectic bonding. Since separately grown light emitting structure is stacked on the light emitting structure using the eutectic metal alloy bonding, it is possible to prevent crystal defects occurring between the light emitting structures when sequentially grown. Further, since the eutectic metal alloy can be formed in various patterns, it is possible to control and optimize adhesive strength, transmittance of the light generated in the upper light emitting structure, and resistance.

20 Claims, 14 Drawing Sheets

(51) Int. Cl.
*H01L 33/44* (2010.01)
*H01L 33/62* (2010.01)
*C22C 5/02* (2006.01)

(56) References Cited

U.S. PATENT DOCUMENTS

2019/0165037 A1* 5/2019 Chae .................... H01L 33/62
2019/0165038 A1* 5/2019 Chae .................... H01L 33/30

* cited by examiner

MULTI-JUNCTION LED WITH EUTECTIC BONDING AND METHOD OF MANUFACTURING THE SAME

TECHNICAL FIELD

The present disclosure is related to a multi-junction LED using eutectic bonding and a method of manufacturing the multi-junction LED, more particularly to a multi-junction LED having a metal bonding layer disposed between light emitting structures by using eutectic bonding.

BACKGROUND ART

A Light Emitting Diode (LED) is a compound semiconductor device that converts current into light and is used as various light sources because of low power consumption and long life. In recent years, application has expanded into areas such as LCD backlight units, displays, vehicle headlamps, and the like, requiring developing LEDs having improved optical characteristics and capable of realizing high output.

In order to realize high output, an LED needs to minimize dislocation defects and point defects. However, due to limitations of the MOCVD process used in formation of an LED, there is a significant amount of dislocation defects that lead to low light output. In order to solve this problem, an LED can be formed by employing various epitaxial growth techniques to realize high output. Also, by introducing flip chip fabrication or vertical LED fabrication, output reducing phenomenon such as droop can be minimized to realize high output.

Recently, active studies of microdisplays using one or more LED chips in a display pixel have been ongoing. A microdisplay is composed of pixels, each of which has red, green, and blue sub-pixels, otherwise similar to a conventional display. That is, a red LED, a green LED, and a blue LED are arranged laterally in the same plane and are connected by wiring to form one pixel. Therefore, three kinds of LEDs are required to constitute one pixel, and the three kinds of LEDs must be disposed adjacent to each other in the same plane. One LED constituting a pixel of a microdisplay needs to have a size of about 10 um or less. However, because one pixel is composed of three LEDs, the size of the pixel exceeds 50 um due to having three LEDs and the need for wiring between the sup-pixel LEDs.

That is, a microdisplay using three LEDs in a pixel has a problem because the size of a pixel is larger than desired due to having three LEDs arranged horizontally.

Technical Problem

The main aspect of the present inventive concept is to provide a multi-junction LED and a method of manufacturing the multi-junction LED using eutectic bonding. Adhesion strength, light transmittance, and resistance between light emitting structures can be easily controlled and optimized by bonding the light emitting structures using eutectic bonding in various patterns.

Technical Solution

One aspect of the present inventive concept provides a multi-junction LED using eutectic bonding comprising a first light emitting structure formed on a substrate, a second light emitting structure formed on the first light emitting structure, a common current spreading/contact layer formed between the first light emitting structure and the second light emitting structure, an insulating layer formed on the second light emitting structure, a third light emitting structure formed on the insulating layer, and a metal bonding layer formed between the third light emitting structure and the insulating layer to bond the third light emitting structure to the insulating layer by using eutectic bonding.

The metal bonding layer has a eutectic metal alloy.

The eutectic metal alloy has Au—Ge alloy or Au—Sn alloy.

The Au in the Au—Ge alloy has a weight ratio ranging from 65 wt % to 80 wt %.

The Au in the Au—Sn alloy has weight ratio ranging from 70 wt % to 90 wt %.

The metal bonding layer is formed on the insulating layer and has a geometry in which one end and the other end of a line forming a rectangle are close to or in contact with each other.

The interior of the rectangle shape of the metal bonding layer is hollow.

The interior of the rectangle shape of the metal bonding layer is filled with lines in a lattice form.

The interior of the rectangle shape of the metal bonding layer is filled with isolated dots.

The multi-junction LED further comprises a first tunnel junction layer formed between the common current spreading layer and the first light emitting layer, and a second tunnel junction layer formed between the common current spreading layer and the second light emitting layer.

The first light emitting structure has a first n-type semiconductor layer, a first active layer and a first p-type semiconductor layer that are sequentially deposited. The second light emitting structure has a second p-type semiconductor layer, a second active layer and a second n-type semiconductor layer that are sequentially deposited. The third light emitting structure has a third p-type semiconductor layer, a third active layer and a third n-type semiconductor layer that are sequentially deposited.

The multi-junction LED has a first mesa structure in which upper layers of the first n-type semiconductor layer are removed to expose a part of an upper surface of the first n-type semiconductor layer, and a second structure in which upper layers of the common current spreading layer are removed to expose a part of an upper surface of the common current spreading layer.

The multi-junction LED has a first negative electrode formed on an upper surface of the first n-type semiconductor layer exposed by the first mesa structure, a first positive electrode formed on an upper surface of the common current spreading layer exposed by the second mesa structure, a second negative electrode formed on the second n-type semiconductor layer, a third negative electrode formed on the third n-type semiconductor layer, and a second positive electrode formed on the insulating layer and electrically connected to the metal bonding layer.

The second positive electrode may be of the same material as the metal bonding layer.

The multi-junction LED further has a conductive layer for electrically connecting the first positive electrode and the second positive electrode.

The first negative electrode, the first positive electrode, the second negative electrode, and the second positive electrode are formed at edges of the LED, respectively.

The first negative electrode is formed on the third light emitting structure and extended to the first n-type semiconductor layer, a first positive electrode is formed on the third light emitting structure and extended to the common current spreading layer, a second negative electrode is formed on the third light emitting structure and extended to the second n-type semiconductor layer, a third negative electrode is formed on the third light emitting structure, and a second positive electrode is formed on the third light emitting structure and extended to the third p-type semiconductor layer.

A conductive layer is formed on the third light emitting structure and electrically connects the first positive electrode and the second positive electrode.

The first light emitting structure emits blue light, the second light emitting structure emits green light, and third light emitting structure emits red light.

Another aspect of the present inventive concept provides a method of manufacturing a multi-junction LED using eutectic bonding comprising forming a first light emitting structure having a first n-type semiconductor layer, a first active layer and a first p-type semiconductor layer on a substrate, sequentially forming a first tunnel junction layer, a common current spreading layer, and a second tunnel junction layer on the first light emitting structure, forming a second light emitting structure having a second p-type semiconductor layer, a second active layer, and a second n-type semiconductor layer on the second tunnel junction layer, forming an insulating layer on the second light emitting structure, forming a metal bonding layer on the insulating layer, and stacking a third light emitting structure formed of a third p-type semiconductor layer, a third active layer, and a third n-type semiconductor layer on the metal bonding layer by using eutectic bonding.

Before forming the insulating layer, a first mesa structure is formed by removing upper layers of the first n-type semiconductor layer such that a part of an upper surface of the first n-type semiconductor layer is exposed, and a second mesa structure is formed to remove upper layers of the common current spreading layer so that a part of an upper surface of the common current spreading layer is exposed.

After forming the insulating layer, a first negative electrode on an upper surface of the first n-type semiconductor layer exposed by the first mesa structure, a first positive electrode on an upper surface of the common current spreading layer exposed by the second mesa structure, a second negative electrode on the second n-type semiconductor layer, a third negative electrode on the third n-type semiconductor layer, a second positive electrode on the insulating layer, the second positive electrode being electrically connected to the metal bonding layer, and a conductive layer that electrically connects the first positive electrode and the second positive electrode are formed.

After stacking a third light emitting structure, a first contact hole extending from the upper surface of the third light emitting structure to the first n-type semiconductor layer, a second contact hole extending from an upper surface of the third light emitting structure to the common current spreading layer, a third contact hole extending from the upper surface of the third light emitting structure to the third p-type semiconductor layer, and a fourth contact hole extending from the upper surface of the third light emitting structure to the second n-type semiconductor layer are formed.

Furthermore, insulating films on the inner side surfaces of the first contact hole, the second contact hole, the third contact hole, and the fourth contact hole are formed.

After forming the insulating films, a first negative electrode in the first contact hole, a first positive electrode in the second contact hole, a second positive electrode in the third contact hole, a second negative electrode in the fourth contact hole, and a third negative electrode on the third light emitting structure are formed. The conductive layer formed on the third light emitting structure electrically connects the first positive electrode and the second positive electrode.

Advantageous Effects

According to the present inventive concept, instead of sequentially growing the conventional light emitting structures, a separately grown third light emitting structure is stacked on the light emitting structures by using a eutectic bonding. Therefore, it is possible to prevent crystal defects that may occur between the light emitting structures.

Further, since the eutectic metal alloy can be formed in various patterns, it is possible to control and optimize adhesive strength, transmittance of light generated in the upper light emitting structure, and resistance.

Furthermore, the metal contacts may be formed to extend from the upper surface of the light emitting diode to the layer to which the metal contact is connected, so that the contacts are all disposed on the upper surface of the light emitting diode, thereby improving the flatness of the metal contacts. Thus, the light emitting diodes constituting one pixel can be vertically stacked to minimize the size of the pixel, and desired colors can be obtained by controlling brightness of each light emitting diode. Also, the light emitting diodes can be easily mounted on a display substrate due to the planarized metal contacts.

Effects of the present inventive concept are not limited to the above-described effects and other unmentioned effects may be clearly understood by those skilled in the art from the following descriptions.

DETAILED DESCRIPTION

Figure 1:
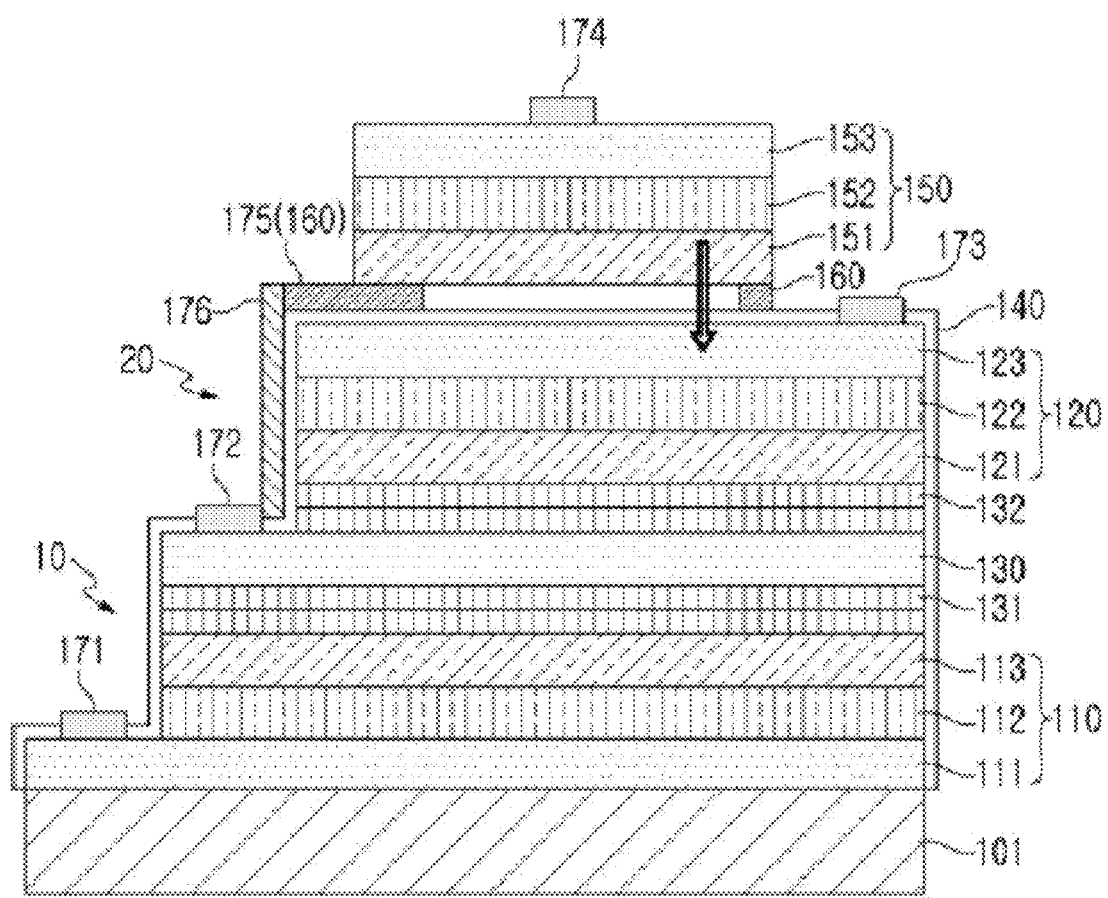
FIG. 1 is a schematic view illustrating an LED according to a first embodiment of the present inventive concept.

Hereinafter, embodiments of the present inventive concept will be described in detail with reference to the accompanying drawings.

While the present inventive concept is susceptible to various modifications and alternative forms, specific embodiments thereof are shown by way of example in the drawings and will herein be described in detail. However, it should be understood that there is no intent to limit the invention to the particular forms disclosed but rather the invention is to cover all modifications, equivalents, and alternatives falling within the spirit and scope of the invention defined by the appended claims.

When an element such as a layer, a region, and a substrate is referred to as being disposed "on" another element, it should be understood that the element may be directly formed on the other element or an intervening element may be interposed therebetween.

It should be understood that, although the terms "first," "second," etc. may be used herein to describe various elements, components, areas, layers, and/or regions, these elements, components, areas, layers, and/or regions are not limited by these terms.

First Embodiment

FIG. 1 is a schematic view illustrating an LED according to a first embodiment of the present inventive concept.

Figure 2:
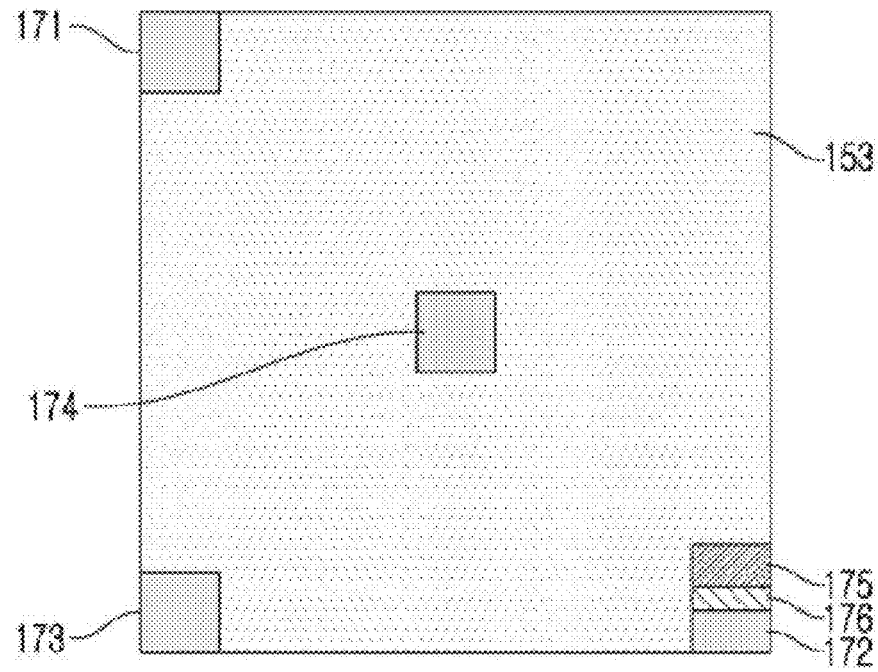
FIG. 2 is an example top view of an LED according to a first embodiment of the present inventive concept.

FIG. 2 is an example top view of an LED according to a first embodiment of the present inventive concept. For reference, FIG. 2 briefly shows an embodiment in which the metal contacts shown in FIG. 1 are located at the corners of the LED. That is, it should be understood by those skilled in the art that the metal contacts shown in FIG. 1 are formed at the corner portions of the respective functional layers and do not disclose the exact cross-section of FIG. 2.

Referring to FIGS. 1 and 2, LED 100 according to a first embodiment of the present inventive concept has a first light emitting structure 110, a second light emitting structure 120, a common current spreading layer 130, an insulating layer 140, a third light emitting structure 150, and a metal bonding layer 160.

The second light emitting structure 120 may have a structure grown on the first light emitting structure 110, and the third light emitting structure 150 may have a structure stacked on the second light emitting structure 120. That is, the first light emitting structure 110, the second light emitting structure 120, and the third light emitting structure 150 may have a sequentially stacked structure. However, the second light emitting structure 120 and the third light emitting structure 150 may be bonded to each other by using a metal bonding layer 160 between the light emitting structures.

Furthermore, the first light emitting structure 110 may emit blue light, the second light emitting structure 120 may emit green light, and the third light emitting structure 150 may emit red light. Accordingly, the light emitted from the light emitting structures can be emitted in the direction from top to bottom, that is, from the third light emitting structure 150 toward the first light emitting structure 110.

The first light emitting structure 110 may be formed on the substrate 101. For example, the substrate 101 may be a sapphire ($Al_2O_3$) substrate, a SiC substrate, a GaN substrate, a GaP substrate, a GaAs substrate, an InP substrate, or a ZnO substrate, but is not limited thereto.

A buffer layer (not shown) may be disposed on the substrate 101 before the first light emitting structure 110 is formed. The buffer layer may be an undoped semiconductor layer to reduce dislocation defects caused by a difference in the lattice constants between the substrate 101 and the light emitting structure. Specifically, for example, the buffer layer may be formed of a Group III-V compound semiconductor material, but is not limited thereto.

The first light emitting structure 110 may include a first n-type semiconductor layer 111, a first active layer 112, and a first p-type semiconductor layer 113. The second light emitting structure 120 may include a second p-type semiconductor layer 121, a second active layer 122, and a second n-type semiconductor layer 123.

That is, the first light emitting structure 110 may have a structure in which a first n-type semiconductor layer 111, a first active layer 112, and a first p-type semiconductor layer 113 are sequentially grown and stacked. The second light emitting structure 120 may have a structure in which the second p-type semiconductor layer 121, the second active layer 122, and the second n-type semiconductor layer 123 are sequentially grown and stacked.

Here, the first n-type semiconductor layer 111 and the second n-type semiconductor layer 123 are compound semiconductor layers that provide electrons to the first active layer 112 and the second active layer 122, respectively, and are compound semiconductor layer of group III-V elements to which an n-type impurity such as Si, N, P, Ge, or Se is added. For example, the first n-type semiconductor layer 111 and the second n-type semiconductor layer 123 may be formed of n-type doped GaN, AlGaN, InGaN, InAlGaN, AlN, InN, AlInN, GaAs, GaAsP, or AlGaAs and concentrations of impurities contained in the first n-type semiconductor layer 111 and the second n-type semiconductor layer 123 may be variously applied according to the embodiment.

The first active layer 112 is a layer that emits first light having first peak emission wavelength by recombination of electrons injected from the first n-type semiconductor layer 111 and holes injected from the first p-type semiconductor layer 113, and second active layer 122 is a layer that emits second light having second peak emission wavelength different from the first light by recombination of electrons injected from the second n-type semiconductor layer 123 and holes injected from the second p-type semiconductor layer 121. Each can emit light of various colors depending on the constituent components and can use all the usual active layer materials. Specifically, for example, the first active layer 112 and the second active layer 122 may have a multi-quantum well (MQW) structure or a single quantum well structure in which $In_xAl_yGa_{(1-x-y)}N$ ($0 \le x < 1$, $0 \le y < 1$, and $0 \le x+y < 1$) layer forms a well layer and $In_aAl_bGa_{(1-a-b)}N$ ($0 \le a < 1$, $0 \le b \le 1$, and $0 \le a+b < 1$) layer forms a barrier layer. Here, a and b specifies a barrier structure irrespective of x and y. Alternatively, the first active layer 112 and the second active layer 122 may comprise a zinc oxide material, such as ZnMgO or ZnCdO, and depending on the embodiment, the first active layer 112 and the second active layer 122 may be made of a doped compound semiconductor. However, the band gap of the well layer of the first active layer 112 needs to be larger than the band gap of the well layer of the second active layer 122, which can be realized by controlling the fraction of In (indium).

The first p-type semiconductor layer 113 and the second p-type semiconductor layer 121 are compound semiconductor layers providing holes in the first active layer 112 and the second active layer 122, respectively, and are compound semiconductor layers of group III-V elements to which a p-type impurity such as Mg, N, P, As, Zn, Li, or Cu is added. For example, the first p-type semiconductor layer 113 and the second p-type semiconductor layer 121 may be p-type doped GaN, AlGaN, InGaN, InAlGaN, AlN, InN, AlInN, GaAs, GaAsP, and the kind and concentration of the impurity contained in the semiconductor layer can be variously applied according to the embodiment.

Subsequently, a common current spreading layer 130 may be disposed between the first and second light emitting structures 110 and 120. A first tunnel junction layer 131 is formed between the first light emitting structure 110 and the common current spreading layer 130, and a second tunnel junction layer 132 is formed between the common current spreading layer 130 and the second light emitting structure 120.

The common current spreading layer 130 may be an n-type semiconductor, for example, n-GaN, but is not limited thereto.

The first tunnel junction layer 131 is disposed on the lower surface of the common current spreading layer 130. The first tunnel junction layer 131 may have a structure in which an $n^{++}$-GaN layer and a $p^{++}$-GaN layer are sequentially stacked in a downward direction from the common current spreading layer 130.

The second tunnel junction layer 132 is disposed on the upper surface of the common current spreading layer 130. The second tunnel junction layer 132 may have a structure in which an $n^{++}$-GaN layer and a $p^{++}$-GaN layer are sequentially stacked in the upward direction from the common current spreading layer 130.

A first tunnel junction layer 131 and a second tunnel junction layer 132 are respectively disposed on a lower surface and an upper surface of a common current spreading layer 130 made of an n-type semiconductor such as n-GaN. Since holes can be injected into the first active layer 112 and the second active layer 122 through the first tunnel junction layer 131 and the second tunnel junction layer 132, an LED in which two light emitting structures are stacked can be realized. In addition, since the common current spreading layer 130 for injecting holes via tunnel junction layers can be formed of an n-type semiconductor whose current spreading characteristic is excellent, light emitting efficiency of the LED can be improved as compared with an LED whose hole injection layer is formed with a p-type semiconductor.

The tunnel junction layers described above may not be a sequential structure of the $n^{++}$-GaN layer and the $p^{++}$-GaN layer. That is, the two tunnel junction layers may be composed of a $p^{++}$-GaN layer only. Zener breakdown of the charge carriers could also be generated by the tunnel junction layers joined to the upper and lower portions of the common current spreading layer 130. Therefore, the common current spreading layer 130 can also be highly doped. When energy states of the n-type conduction band and the p-type valance band are at the same level or the p-type valance band is higher than the n-type conduction band due to the Zener breakdown, electron tunneling is generated by reverse biasing. So, holes are supplied from the n-type common current spreading layer 130 to the active regions 112 and 122.

In particular, since the common current spreading layer 130 is doped with n-type, it has an excellent current spreading capability. Therefore, the charge carriers can be uniformly distributed over the entire area of the active layers 112 and 122 in which the light emitting operation is performed, thereby leading to an increase in light emitting efficiency.

In addition, in the present inventive concept, the common current spreading layer 130 may be highly doped with an n-type dopant. Doping at a high concentration means that the highly doped layer has a higher dopant concentration than the first n-type semiconductor layer 111. Also, $n^{++}$ doping has a higher dopant concentration than the first n-type semiconductor layer 111. In addition, the $p^{++}$ doping has a higher dopant concentration than the first p-type semiconductor layer 113 or the second p-type semiconductor layer 121. Hereinafter, the meaning of $n^{++}$ doping and the meaning of $p^{++}$ doping with respect to the doping level are applied as above described.

In addition, the layers formed on the substrate 101 may be formed through a known deposition method. For example, the layers may be formed by metal organic chemical vapor deposition (MOCVD), hydride vapor phase epitaxy (HYPE), molecular beam epitaxy (MBE), plasma laser deposition (PLD), or sputtering, but is not limited to thereto.

The LED 100 according to the first embodiment of the present inventive concept may include a first mesa structure 10, in which parts of upper layers of the first n-type semiconductor layer 111 are removed to expose a part of the upper surface of the first n-type semiconductor layer 111. A first negative electrode 171 may be disposed on the upper surface of the first n-type semiconductor layer 111 exposed by the etched portion of the first mesa structure 10.

In addition, it may include a second mesa structure 20 for exposing a part of the upper surface of the common current spreading layer 130. A first positive electrode 172 may be disposed on the upper surface of the common current spreading layer 130 exposed by the etched portion of the second mesa structure 20.

Furthermore, the exposed portions of the common current spreading layer 130 and the first n-type semiconductor layer 111 can be slightly etched.

In addition, a second negative electrode 173 may be disposed on the second n-type semiconductor layer 123. Accordingly, a current may be applied to the first light emitting structure 110 through the first negative electrode 171 formed on the first n-type semiconductor layer 111 and the first positive electrode 172 formed on the common current spreading layer 130. A current may be applied to the second light emitting structure 120 through the second negative electrode 173 formed on the second n-type semiconductor layer 123 and the first positive electrode 172 formed on the common current spreading layer 130. That is, holes are injected through the common current spreading layer 130, and electrons are injected by the first n-type semiconductor layer 111 and the second n-type semiconductor layer 123. The injected holes and electrons are recombined in the first active layer 112 and the second active layer 122, respectively, so that the first and second light emitting structures 110 and 120 emit light. For example, the first light emitting structure 110 may emit blue light, and the second light emitting structure 120 may emit green light.

The insulating layer 140 is a layer for insulating the upper portion of the second light emitting structure 120 from the third light emitting structure 150, and may be formed of $SiO_2$, for example.

The insulating layer 140 is formed on the second light emitting structure 120 and surrounds side surfaces of the first light emitting structure 110, the second light emitting structure 120, the common current spreading layer 130, the first tunnel junction layer 131 and the second tunnel junction layer 132. More specifically, the insulating layer 140 is formed on the upper surface and side surfaces of the first light emitting structure 110 except for the first negative electrode 171 formed on the first n-type semiconductor layer 111, the upper surface and side surfaces of the common current spreading layer 130 except for the first positive electrode 172, the side surfaces of the first tunnel junction layer 131 and the second tunnel junction layer 132, and the upper surface and the side surfaces of the second light emitting structure 120 except for the second negative electrode 173 formed on the second n-type semiconductor layer 123.

The third light emitting structure 150 is stacked on the second light emitting structure 120, and the third light emitting structure 150 is formed on the second light emitting structure 120 with the metal bonding layer 160 formed on the insulating layer 140. That is, the third light emitting structure 150 is not formed by sequentially growing on the second light emitting structure 120, but is grown separately in a separate epitaxial process. So, the third light emitting structure 150 is bonded to the second light emitting structure 120 by the metal bonding layer 160.

Therefore, the LED according to the present inventive concept can prevent the crystal defects that would be generated between the second light emitting structure 120 and the third light emitting structure 150 for a conventionally grown light emitting structure, that is, sequentially grown.

The third light emitting structure 150 may include a third p-type semiconductor layer 151, a third active layer 152, and a third n-type semiconductor layer 153. That is, a third active layer 152 may be formed on the third p-type semiconductor layer 151, and a third n-type semiconductor layer 153 may be formed on the third active layer 152. Also, a third negative electrode 174 may be formed on the third n-type semiconductor layer 153. Therefore, the third light emitting structure 150 is stacked on the second light emitting structure 120 by using the metal bonding layer 160, and the third p-type semiconductor layer 151 of the third light emitting structure 150 is formed on the metal bonding layer 160. For example, the third light emitting structure 150 may emit red light.

The metal bonding layer 160 is formed on the insulating layer 140 and may be formed in a pattern. The metal bonding layer 160 functions to bond the insulating layer 140 and the third light emitting structure 150 to each other. The third p-type semiconductor layer 151 of the third light emitting structure 150 is in ohmic contact with the metal bonding layer 160 so that the third light emitting structure 150 and the metal bonding layer 160 are electrically connected to each other. However, since the metal bonding layer 160 is formed on the insulating layer 140 surrounding the second light emitting structure 120, the negative contacts of the first and second light emitting structures 110 and 120 are electrically insulated from the positive contact of the light emitting structure 150.

The metal bonding layer 160 may be a eutectic metal alloy, and the metal bonding layer 160 may include Au—Ge or Au—Sn alloy. As an example, in the case of an alloy of Au—Ge, Au at a temperature of 361° C. may have a weight ratio ranging from 65 wt % to 80 wt %, and more preferably from 70 wt % to 75 wt %, and more preferably 72 wt %. In the case of an Au—Sn alloy, Au may have a weight ratio ranging from 70 wt % to 90 wt % at a temperature of 280° C., more preferably from 75 wt % to 85 wt %, and more preferably 80 wt %.

The metal bonding layer 160 needs to be electrically connected to the third p-type semiconductor layer 151. This is because the third light emitting structure 150 emits red light and is provided through an epitaxial growth process that is separate from the first and second light emitting structures 110 and 120. For example, the third light emitting structure 150 is a separate structure grown on a substrate such as GaAs, and the third p-type semiconductor layer 151 is electrically connected to the metal bonding layer 160 through the eutectic bonding process.

In FIG. 2, a substantially quadrangular upper flat surface corresponds to the third n-type semiconductor layer 153, and a first negative electrode 171, a second negative electrode 173, a first positive electrode 172, and a second positive electrode 175 are formed at the corner portion. A third negative electrode 174 is disposed in the central portion.

The first negative electrode 171 is formed on the first n-type semiconductor layer 111 that is exposed by a partial etching of the first light emitting structure 110 and an etch process for completely penetrating the third light emitting structure 150 and the second light emitting structure 120. The second negative electrode 173 may be formed at a position opposite to the first negative electrode 171 or at an adjacent corner of the second light emitting structure 120. The second negative electrode 173 may be formed on the second light emitting structure 120 through penetrating the third light emitting structure 150. In addition, the third negative electrode 174 may be formed at the center of the uppermost layer plane where the LED is formed, but the placement is not limited. If light generated in the third active layer 152 can be reflected toward the substrate 101, the third negative electrode 174 can accordingly have various shapes to enhance light reflection. For example, the third negative electrode 174 may be formed to cover the entire surface of the third n-type semiconductor layer 153.

The first positive electrode 172 is formed on the common current spreading layer 130 exposed through the third light emitting structure 150 and the second light emitting structure 120 penetrated therethrough. The region where the first positive electrode 172 is formed is the remaining corner portions of the LED to avoid regions where the first negative electrode 171 and the second negative electrode 173 are formed. A second positive electrode 175 is formed around the corner region where the first positive electrode 172 is formed. In other words, it is not formed in another corner and should be formed in the same corner as the first positive electrode 172 as shown on the plan view. The second positive electrode 175 is at a portion where the metal bonding layer 160 is exposed to the outside through etching and is physically connected to at least a part of the metal bonding layer 160. That is, a part of the metal bonding layer 160 used for the eutectic bonding is used as the second positive electrode 175. The first positive electrode 172 and the second positive electrode 175 are electrically connected to each other. A conductive layer 176 is used for electrical connection between the first positive electrode 172 and the second positive electrode 175, and a conductive layer 176 is electrically insulated from the second active layer 122 and the second n-type semiconductor layer 123 of the second light emitting structure 120 by the insulating layer 140 formed on the side surface.

Accordingly, the first and second light emitting structures 110 and 120 share the common current spreading layer 130, and the common current spreading layer 130 is connected to the first positive electrode 172. The third p-type semiconductor layer 151 of the third light emitting structure 150 is connected to the second positive electrode 175. Since the first positive electrode 172 and the second positive electrode 175 are connected to each other through the conductive layer 176, the LED of the present inventive concept has one positive terminal electrically. On the other hand, the three negative electrodes are not connected to each other.

Figure 3:
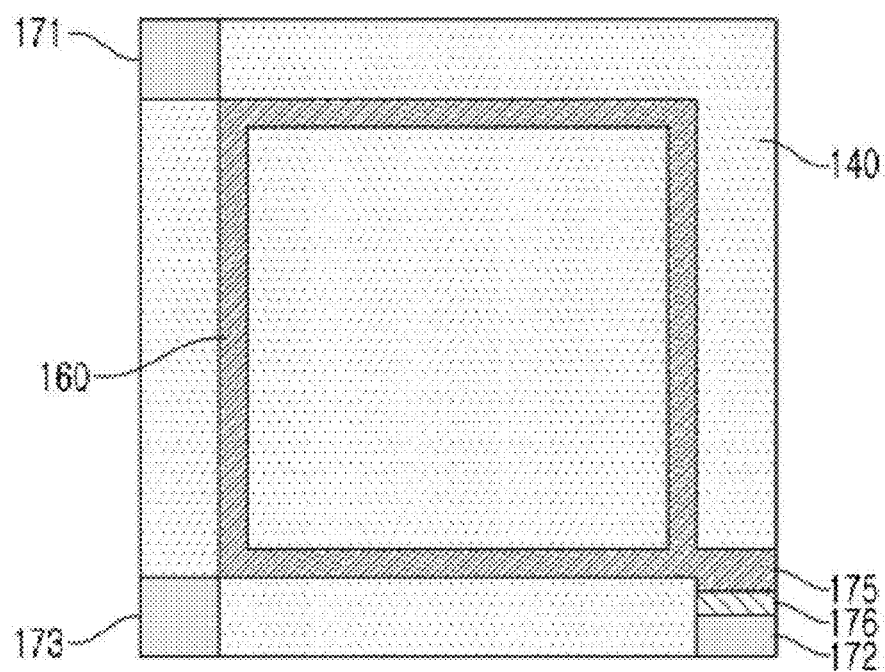
FIG. 3 is a view schematically showing a metal bonding layer of a first embodiment according to the present inventive concept.

FIG. 3 is a view schematically showing a metal bonding layer of first embodiment according to the present inventive concept.

Figure 5:
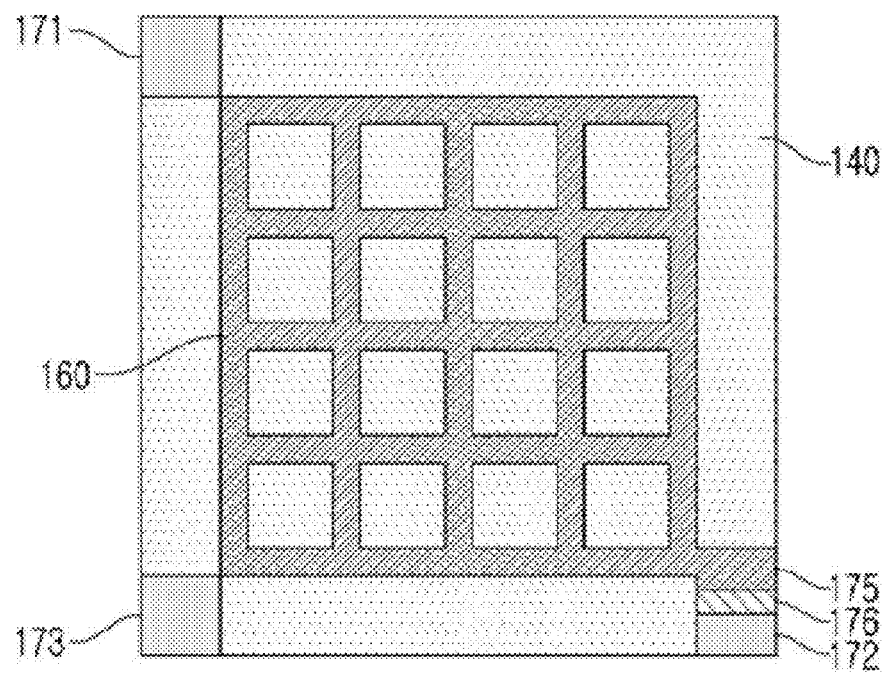
FIG. 5 is another view schematically showing the metal bonding layer according to the present inventive concept.
Figure 6:
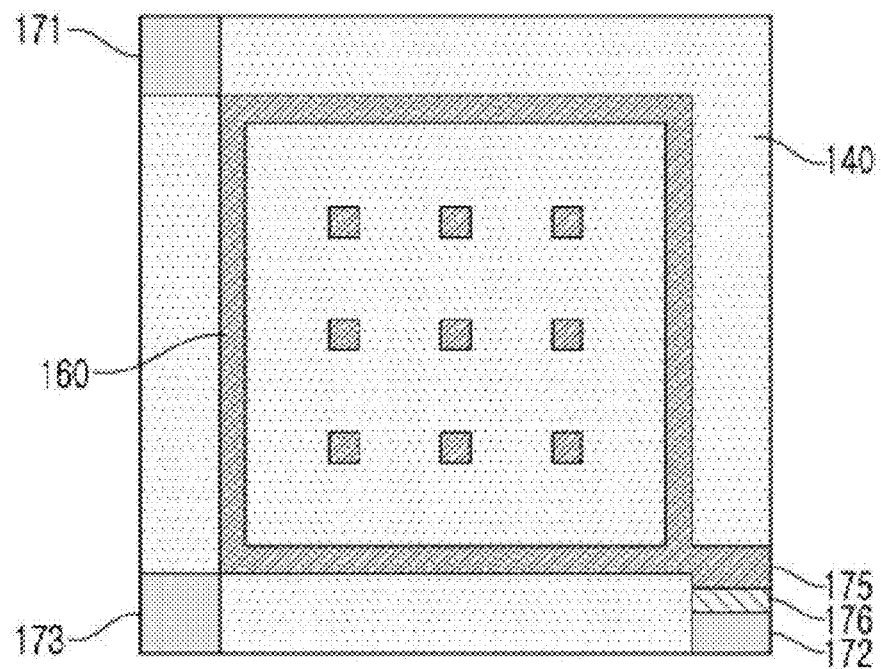
FIG. 6 is still another view schematically showing the metal bonding layer according to the present inventive concept.

For reference, FIGS. 3, 5 and 6 are diagrams schematically showing embodiments in which the electrodes shown in FIG. 1 are positioned at the edges of an LED.

Referring to FIG. 3, the metal bonding layer 160 according to the first embodiment of the present inventive concept is formed on the insulating layer 140, has a predetermined thickness, and may have a stripe shape in which one end and the other end are close to or in contact with each other. More specifically, the inside of the rectangle shape may be hollow. For reference, in the drawing, while the shape is that of a hollow square, it may be various others such as a circle, a triangle, and a rhombus. That is, the metal bonding layer 160 in the form of a hollow polygon is formed, and the third light emitting structure 150 is stacked on the metal bonding layer 160 to be bonded to the metal bonding layer 160. Accordingly, the light emitted from the third light emitting structure 150 through the hollow interior can travel toward the second light emitting structure 120. For example, the hollow interior may be filled with a resin and the like.

Furthermore, the second positive electrode 175 which functions as an electrode for the third light emitting structure 150 may be formed on a predetermined portion of the metal bonding layer 160 formed in a stripe shape. That is, the second positive electrode 175 may be connected to the metal bonding layer 160 and may be formed of the same material as the metal bonding layer 160. Accordingly, since the second positive electrode 175 may have a structure that is electrically connected to the third light emitting structure 150, a current from the second positive electrode 175 to the third negative electrode 174 can flow through the third light emitting structure 150.

The second positive electrode 175 may be electrically connected to the first positive electrode 172 through a conductive layer 176 extending from the second positive electrode 175 to the first positive electrode 172, as shown in FIG. 1. Accordingly, the p-type semiconductor layers of the first, second and third light emitting structures 110, 120 and 150 are connected to each other through the positive electrode structure. That is, they share a common positive terminal in a circuit.

Figure 4:
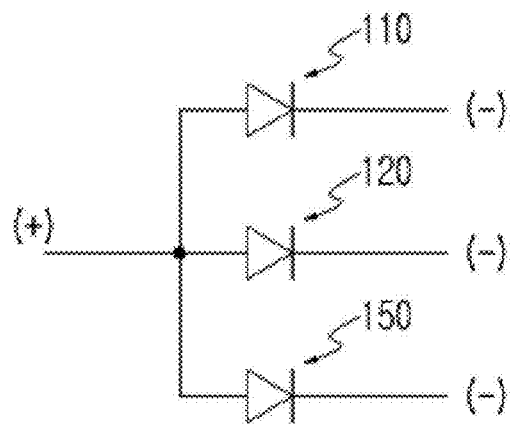
FIG. 4 is a simplified circuit diagram of an equivalent circuit of an LED according to the present inventive concept.

FIG. 4 is a simplified circuit diagram of an equivalent circuit of a LED according to the present inventive concept.

Referring to FIG. 4, the first positive electrode 172 of the common current spreading layer 130 and the second positive electrode 175 connected to the third light emitting structure 150 are electrically connected to each other. So, the positive electrodes of an equivalent diode formed by the first light emitting structure 110, an equivalent diode formed by the second light emitting structure 120, and the equivalent diode formed by the third light emitting structure 150 may be connected to each other in common. Accordingly, it is possible to control the brightness of the light emitted from the light emitting structure by controlling the magnitude of the current or voltage applied to the negative electrodes 171, 173, and 174 of the respective diodes.

As described above, the third light emitting structure 150 can be bonded to the insulating layer 140 formed on the second light emitting structure 120 through the metal bonding layer 160 according to the first embodiment. A current may be applied to the third light emitting structure 150 by using the third negative electrode 174 and the second positive electrode 175 connected to the metal bonding layer 160.

FIG. 5 is another view schematically showing the metal bonding layer according to the present inventive concept.

Referring to FIG. 5, the metal bonding layer 160 formed on the insulating layer 140 is formed in a grid pattern. In contrast to the FIG. 3, the metal bonding layer 160 may be filled in a lattice form. The adhesive force between the metal bonding layer 160 and the insulating layer 140 or between the metal bonding layer 160 and the third light emitting structure 150 can be improved as compared with the pattern for the metal bonding layer 160 of FIG. 3. Furthermore, the bonding strength the second positive electrode 175 can be improved. Since the light emitted from the third light emitting structure 150 must pass through the inside of the rectangle shape filled with the lattice pattern, the light entering the second light emitting structure 120, as compared with the metal bonding layer of FIG. 3, could be reduced.

FIG. 6 is still another view schematically showing the metal bonding layer according to the present inventive concept.

Referring to FIG. 6, the metal bonding layer 160 is formed in a stripe shape. Unlike the metal bonding layer of FIG. 3, inside of the metal bonding layer 160 is not hollow, and the metal bonding layer 160 has isolated dots spaced apart from one another at a predetermined interval. The adhesion between the metal bonding layer 160 and the insulating layer 140 or between the metal bonding layer 160 and the third light emitting structure 150 can be improved compared to the pattern for the metal bonding layer 160 shown in FIG. 3, but the electrical contact by the second positive electrode 175 is not greatly improved.

As described above, the LED according to the present inventive concept can control and optimize the bonding strength, transmittance of light generated in the upper light emitting structure, and the resistance by forming the metal bonding layer 160 in various patterns. Further, as shown in FIGS. 2, 3, 5, and 6, the electrodes are formed at the corners of the LED, thereby yield and operating efficiency are improved by minimizing optical interference by the metal contacts when the LED is mounted on an electronic device and the like.

In addition, the third light emitting structure 150 is bonded on the second light emitting structure 120 through a eutectic process, the metal bonding layer 160 used for bonding is used as the second positive electrode 175, and the second positive electrode 175 is electrically connected to the first positive electrode 172 through the conductive layer 176. That is, three diodes share a positive electrode, and the current and the degree of light emission of each of the diodes can be manipulated through controlling voltages at the respective negative electrodes.

Accordingly, a pixel capable of emitting white light and light of various colors and brightness can be realized.

FIGS. 7 to 13 are views for explaining a method of manufacturing an LED according to a first embodiment of the present inventive concept.

Figure 7:
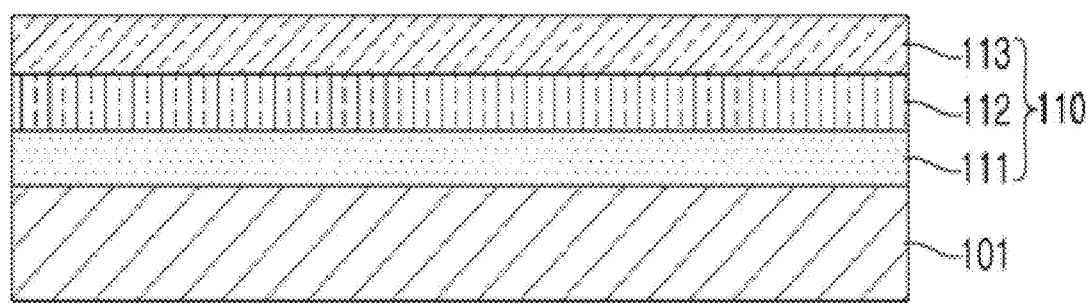
FIGS. 7 to 13 are views for explaining a method of manufacturing an LED according to a first embodiment of the present inventive concept.

Referring to FIG. 7, stacked layers for the first light emitting structure 110 is formed on a substrate 101 such as, for example, sapphire. The first light emitting structure 110 may be formed by sequentially depositing a first n-type semiconductor layer 111, a first active layer 112, and a first p-type semiconductor layer 113 on a substrate 101. The first n-type semiconductor layer 111 may be, for example, n-GaN, and the first p-type semiconductor layer 113 may be p-GaN. Also, the first active layer 112 preferably has a multi-quantum well structure and has a structure in which a well layer and a barrier layer are alternately formed for emitting blue light.

Figure 8:
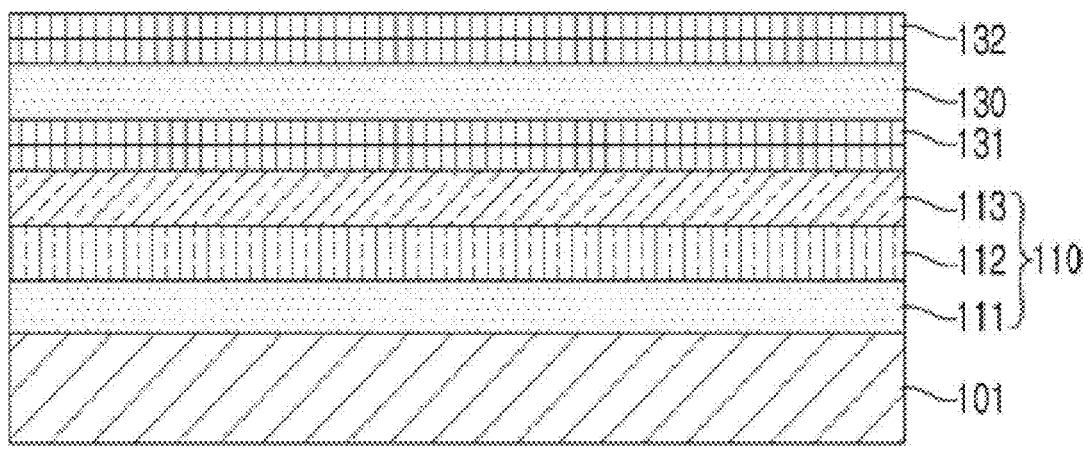

Referring to FIG. 8, a first tunnel junction layer 131, a common current spreading layer 130, and a second tunnel junction layer 132 may be sequentially deposited on the first light emitting structure 110. The first tunnel junction layer 131 may have a structure in which a p$^{++}$-GaN layer and an n$^{++}$-GaN layer are stacked upward. The common current spreading layer 130 may be, for example, n-GaN. In addition, the second tunnel junction layer 132 may have a structure in which an n"-GaN layer and a p$^{++}$-GaN layer are sequentially stacked upward.

In addition, the tunnel junction layers 131 and 132 may be formed only of the p$^{++}$-GaN. If a reverse bias can be applied on the common current spreading layer 130, the common current spreading layer 130 and the p$^{++}$-GaN layers above and below the common current spreading layer 130 can operate as tunnel junction layers.

Figure 9:
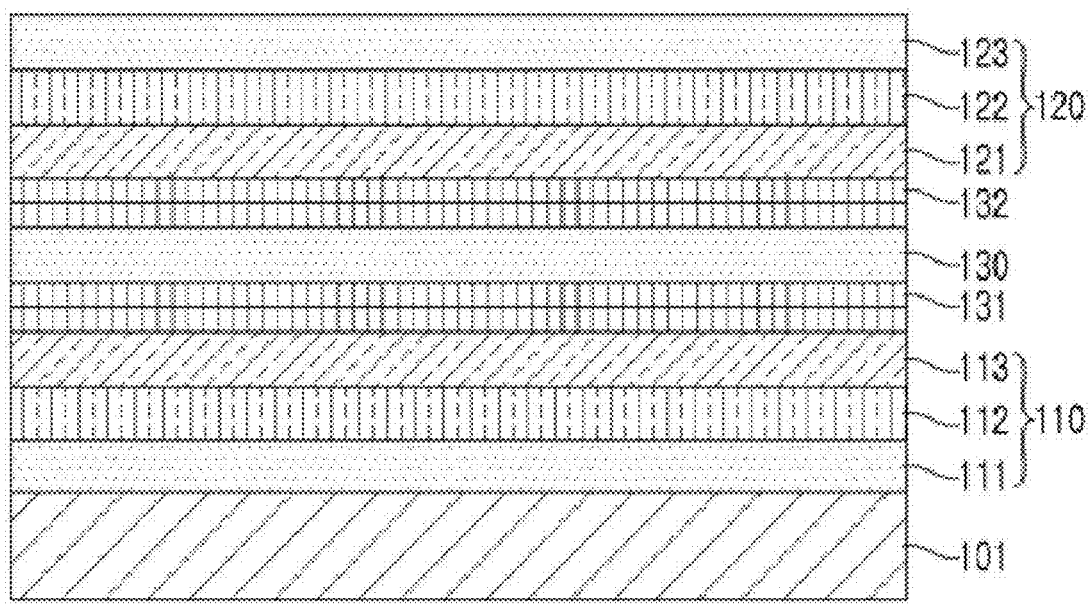

Referring to FIG. 9, the second light emitting structure 120 may be formed on the second tunnel junction layer 132. For example, a second p-type semiconductor layer 121, a second active layer 122, and a second n-type semiconductor layer 123 may be sequentially deposited on the second tunnel junction layer 132. The second p-type semiconductor layer 121 may be formed of p-GaN and the second n-type semiconductor layer 123 may be formed of n-GaN. In addition, the second active layer 122 has a multiple quantum well structure, and it is preferable to control the fraction of In (indium) so that the well layers emit green light. Therefore, the fraction of In in the well layers of the second active layer 122 should be higher than the fraction of In of the first active layer.

Figure 10:
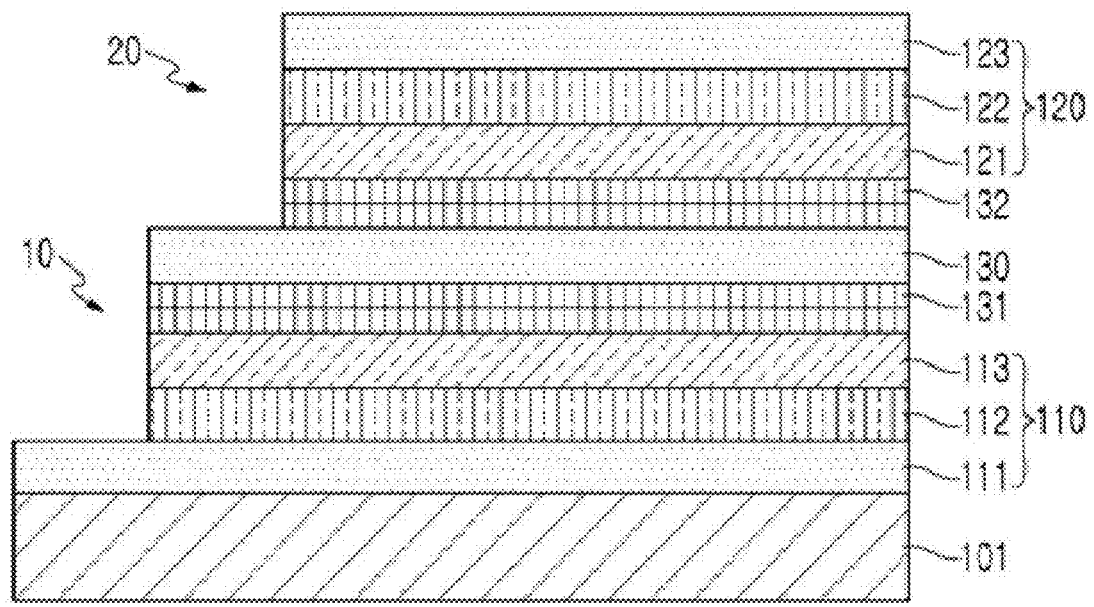

Referring to FIG. 10, a first mesa structure 10 and a second mesa structure 20 are formed. The first mesa structure 10 may be formed by removing a part of the upper layers of the first n-type semiconductor layer 111 to expose a part of the upper surface of the first n-type semiconductor layer 111. By etching the first n-type semiconductor layer 111, the first active layer 112, the first p-type semiconductor layer 113, the first tunnel junction layer 131, and the common current spreading layer 130, the formation of the first mesa structure 10 is completed.

When the first mesa structure 10 is completed, the second mesa structure 20 is formed to expose a part of the upper surface of the common current spreading layer 130. The second mesa structure 20 may be formed by removing a part of a second tunnel junction layer 132, a second p-type semiconductor layer 121, a second active layer 122 and a second n-type semiconductor layer 123 on the common current spreading layer 130. By etching the second p-type semiconductor layer 121, the second active layer 122, the second n-type semiconductor layer 123, and the second tunnel junction layer 132, the formation of second mesa structure 20 is completed.

Figure 11:
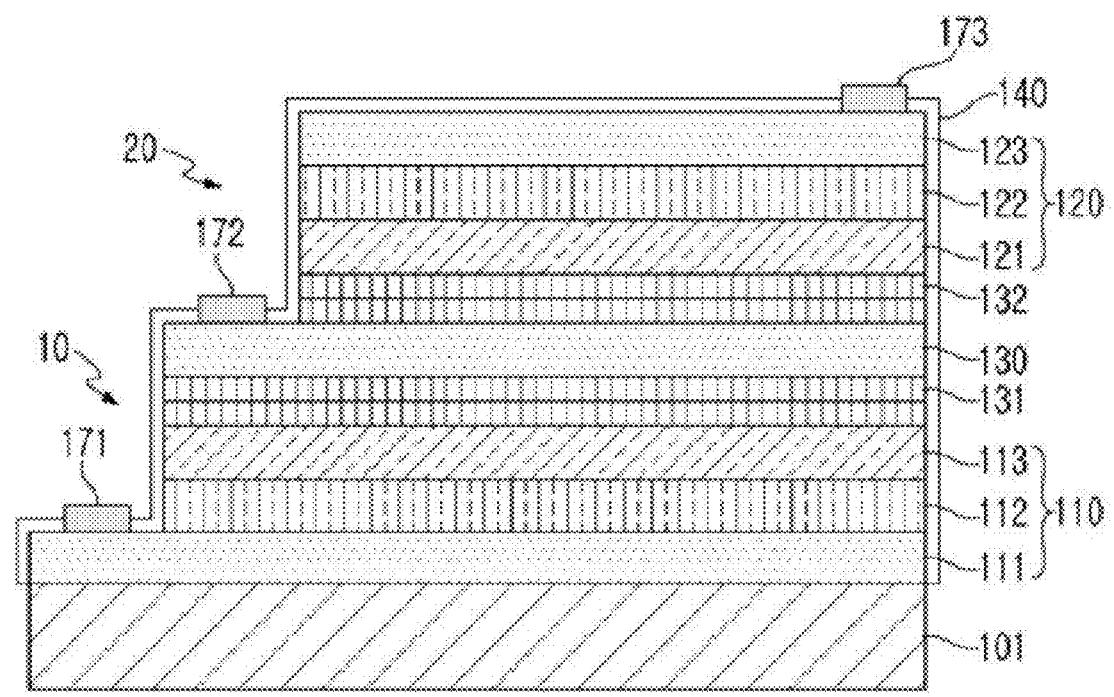

Referring to FIG. 11, an insulating layer 140 and a metal contact may be formed. The insulating layer 140 may be formed of SiO2, and formed to surround the first light emitting structure 110, the common current spreading layer 130, the first tunnel junction layer 131 and the second tunnel junction layer 132. However, parts of the insulating layer 140 may be removed by etching at regions in which metal contacts are formed. The regions are on the upper surface of the first n-type semiconductor layer 111 exposed through the first mesa structure 10, the upper surface of the common current spreading layer 130 exposed through the second mesa structure 20, and the upper surface of the second n-type semiconductor layer 123. Thus, the first negative electrode 171 is formed on the top surface of the first n-type semiconductor layer 111 from which the insulating layer 140 is removed, a first positive electrode 172 is formed on the top surface of the common current spreading layer 130, and the second negative electrode 173 is formed on the upper surface of the second n-type semiconductor layer 123.

Figure 12:
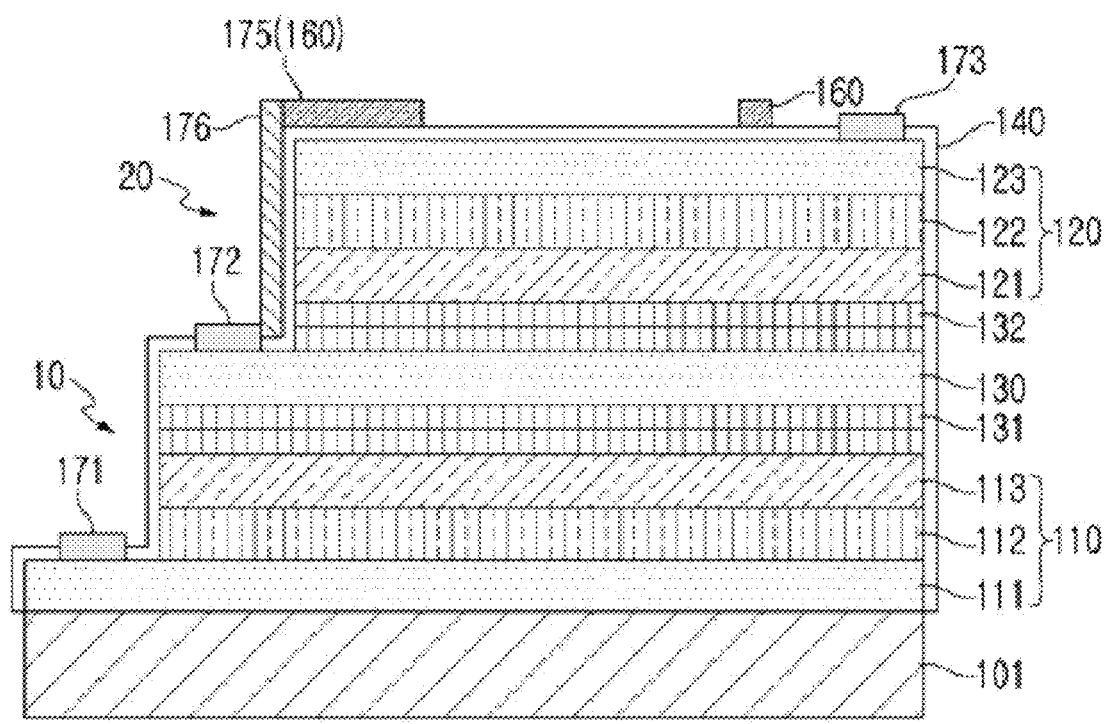

Referring to FIG. 12, a metal bonding layer 160 and a second positive electrode 175 are formed. The metal bonding layer 160 is formed on the insulating layer 140. The metal bonding layer 160 may be formed in various patterns such as a square shape with a hollow interior, a grid pattern filled with a lattice, or a geometry with isolated dots spaced apart at a predetermined interval.

The second positive electrode 175 may be formed in a band-shaped at a predetermined portion of the metal bonding layer 160 and may, for example, be formed at the same time as forming the pattern of the metal bonding layer 160. That is, the second positive electrode 175 is electrically connected to the metal bonding layer 160 and may be formed of the same material as the metal bonding layer 160.

The material used as the metal bonding layer 160 may include any one of Au—Ge and Au—Sn alloys. As an example, in the case of an alloy of Au—Ge, Au at a temperature of 361° C. may have a weight ratio ranging from 65 wt % to 80 wt %, preferably 70 wt % to 75 wt %, and more preferably 72 wt %. In the case of an Au—Sn alloy, Au may have a weight ratio ranging from 70 wt % to 90 wt % at a temperature of 280° C., preferably from 75 wt % to 85 wt %, and more preferably 80 wt %.

After the second positive electrode 175 is formed, a conductive layer 176 for electrically connecting the second positive electrode 175 and the first positive electrode 172 may be formed. That is, the conductive layer 176 acts as a bridge that makes an electrical connection between the two positive electrodes 172 and 175 that are spatially separated as shown in FIG. 12. In addition, the two positive electrodes 172 and 175 preferably occupy one corner in the plane of the substantially square LED in FIG. 2.

Figure 13:
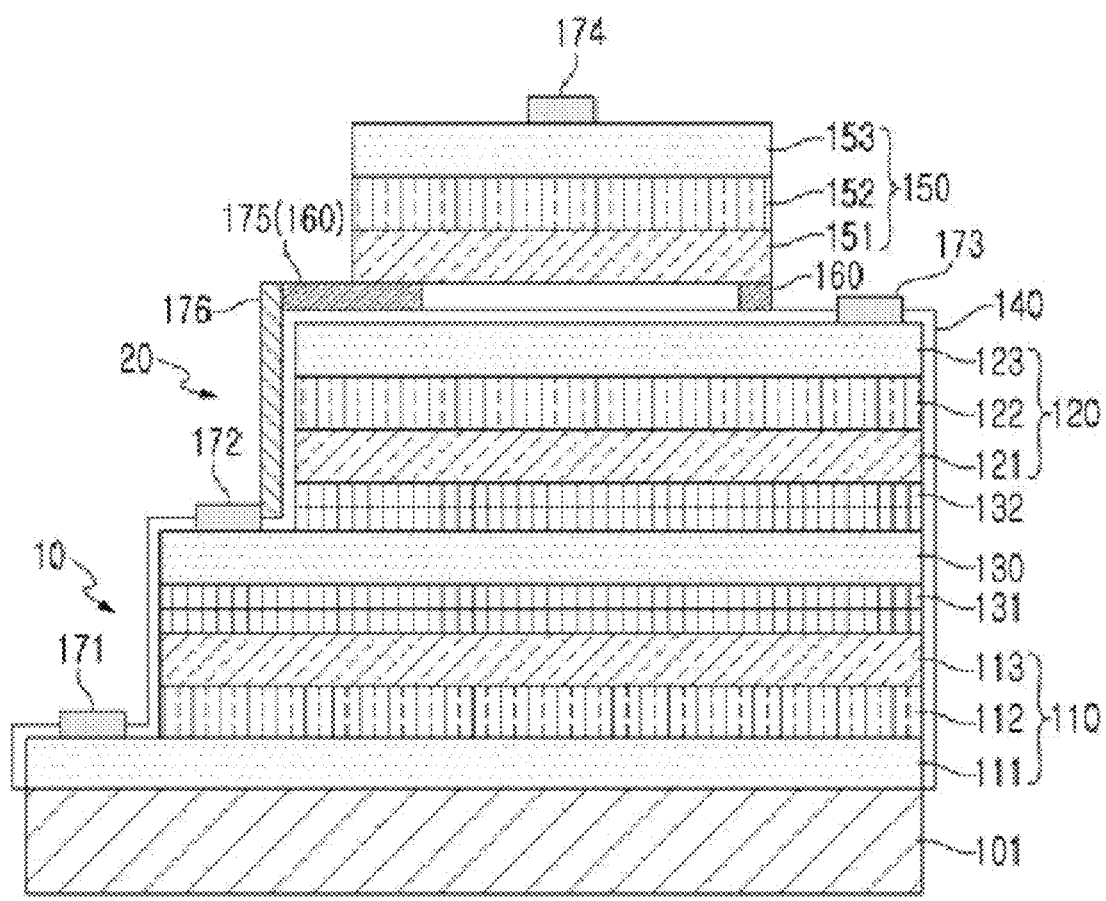

Referring to FIG. 13, the third light emitting structure 150 may be stacked on the metal bonding layer 160. Before the third light emitting structure 150 is stacked on the metal bonding layer 160, the third n-type semiconductor layer 153 and the third active layer 152 and the third p-type semiconductor layer 151 are sequentially deposited to form the third light emitting structure 150 on a different substrate, and then stacked on the metal bonding layer 160. The third p-type semiconductor layer 151 may be a p-type doped AlInGaP, GaAs, GaP, AlGaP, InGaP, GaN, AlInGaAs, InGaAs or AlGaAs, for example. The third n-type semiconductor layer 153 may be a n-type doped AlInGaP, GaAs, GaP, AlGaP, InGaP, GaN, AlInGaAs, InGaAs, or AlGaAs. However, the types and concentration of impurities contained in the semiconductor layers can be variously applied according to the embodiments.

The substrate for depositing the third light emitting structure 150 may be GaAs. AlInGaP doped with Si on the GaAs substrate is used as the third n-type semiconductor layer 153, and an AlInGaP-based quantum well structure as the third active layer 152 can be used. The third p-type semiconductor layer 151 may be Mg-doped AlInGaP. A structure is shown in which a third n-type semiconductor layer 153, a third active region 152, and a third p-type semiconductor layer 151 are sequentially formed on a GaAs substrate. Subsequently, the third light emitting structure 150 formed on the GaAs substrate is bonded onto the metal bonding layer 160. The GaAs substrate is not bonded onto the metal bonding layer 160 whereas the third p-type semiconductor layer 151 is directly bonded. Or, a separate functional layer that can be formed on the third p-type semiconductor layer 151 can be attached to the metal bonding layer 160. The separate functional layer may be another conductive layer for current diffusion, including a metal or a conductive oxide. Therefore, the GaAs substrate on which the third light emitting structure 150 is formed is disposed at the portion that is farthest away from the metal bonding layer 160. Thereafter, the GaAs substrate is dissolved in an acidic solution, so that the GaAs substrate is completely removed. After the GaAs substrate is removed, a third negative electrode 174 is formed on the third n-type semiconductor layer 153.

Second Embodiment

Figure 14:
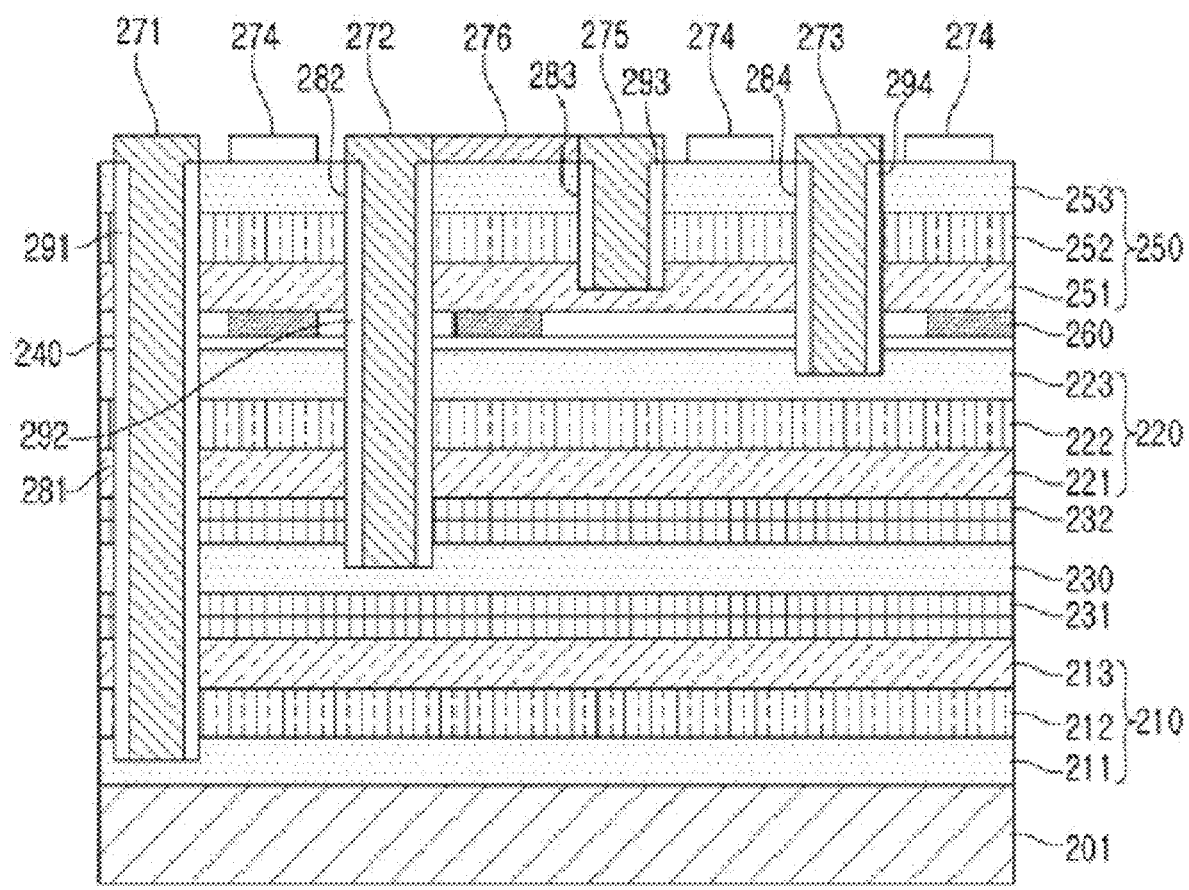
FIG. 14 is a view schematically showing an LED according to a second embodiment of the present inventive concept.

FIG. 14 is a view schematically showing an LED according to a second embodiment of the present inventive concept.

Figure 15:
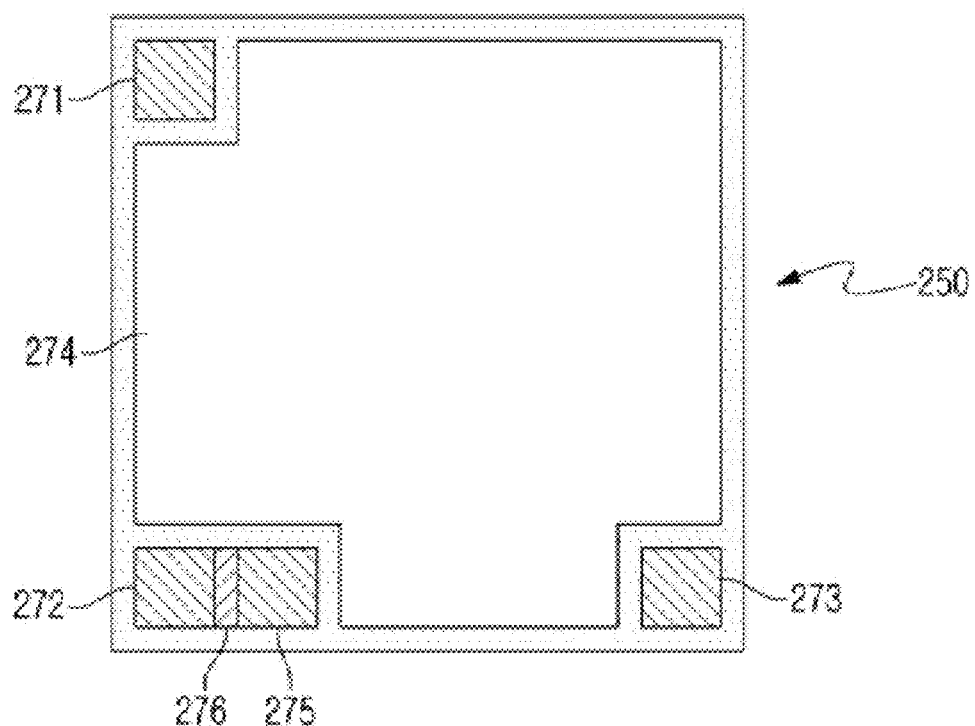
FIG. 15 is a top view of an LED according to a second embodiment of the present inventive concept.

FIG. 15 is a top view of an LED according to a second embodiment of the present inventive concept.

Referring to FIGS. 14 and 15, an LED 200 according to a second embodiment of the present inventive concept has a first light emitting structure 210, a second light emitting structure 220, a common current spreading layer 230, an insulating layer 240, a third light emitting layer 250, and a metal bonding layer 260.

The LED 200 of the second embodiment has the first light emitting structure 210, the second light emitting structure 220, and the third light emitting structure 250 which are sequentially stacked in the same manner as the first embodiment. Furthermore, the insulating layer 240 is formed on the second light emitting structure 220 so that the upper portion of the second light emitting structure 220 and the third light emitting structure 250 are electrically insulated from each other. Further, the metal bonding layer 260 that is formed on the insulating layer 240 has a pattern. Accordingly, the third light emitting structure 250 may be bonded to the insulating layer 240 formed on the second light emitting structure 220 by the metal bonding layer 260.

However, the shape and the type of conductive electrodes of the LED 200 according to the second embodiment are different from the corresponding shape and the type of the first embodiment. In other words, unlike the electrode shapes formed on the layers exposed by the mesa structure in the first embodiment, the electrodes of the LED 200 according to the second embodiment are embedded in a downward direction from the upper surface of the LED to the layer to which the electrodes are connected. For example, the contact holes 281, 282, 283, and 284 may be formed to extend from the upper surface of the third light emitting structure 250 to a layer to which the electrodes are connected.

Hence, the first negative electrode 271 may be formed to extend from the upper surface of the third light emitting structure 250 to the first n-type semiconductor layer 211 of the first light emitting structure 210, and the first positive electrode 272 may be formed to extend from the upper surface of the third light emitting structure 250 to the common current spreading layer 230. The second positive electrode 275 is formed to extend from the upper surface of the third light emitting structure 250 to the third p-type semiconductor layer 251 of the third light emitting structure 250, and the second negative electrode 273 is formed to extended from the upper surface of the third light emitting structure 250 to the second n-type semiconductor layer 223. The third negative electrode 274 may be formed on the third light emitting structure 250 as shown in the first embodiment.

Further, since each of the electrodes has an extended structure to be electrically connected to the corresponding layers, and having a structure that insulates the electrodes from the other layers is required, the sides of each extended metal electrodes can be surrounded by insulating films 291, 292, 293, and 294.

In order to realize the equivalent circuit shown in FIG. 4, the first positive electrode 272 and the second positive electrode 275 may be electrically connected to each other by a conductive layer 276 formed on the upper surface of the third light emitting structure 250. Accordingly, the LED 200 according to the second embodiment may also include the first light emitting structure 210, the second light emitting structure 220, and the third light emitting structure 250 of which the positive electrodes are mutually connected like the LED 100 according to the first embodiment, so that the brightness of light emitted from each light emitting structure can be controlled.

As described above, unlike the LED 100 according to the first embodiment, the LED 200 according to the second embodiment has embedded electrodes having different heights, all the electrodes are formed to extend to the upper surface of the LED and arranged at the upper surface of the LED. So, the flatness of the electrodes can be improved. Therefore, when the LED is mounted on an electronic device and the like, operating efficiency can be improved.

It should be noted that FIG. 14 is a cross-sectional view, but for convenience of description, it is not drawn to scale with respect to FIG. 15 which corresponds to a plan view. FIG. 14 is a view for explaining that the electrodes are formed through a part of the first light emitting structure 210, the second light emitting structure 220, and the third light emitting structure 250. The position of the electrodes formed in the LED should be referred to FIG. 15.

Referring to FIG. 15, the first negative electrode 271 and the second negative electrode 273 occupy two of the four corners of a substantially quadrangular LED plane. The two corners where the two negative electrodes 271 and 273 are disposed can be variously changed according to the designer. The first positive electrode 272 and the second positive electrode 275 are connected to each other through the conductive layer 276 and the two positive electrodes 272 and 275 occupy one of the four corners. Further, the third negative electrode 274 occupies most of the upper surface of the LED and occupies most of the area other than the areas occupied by the other electrodes at the corner.

In particular, the third negative electrode 274 preferably functions as a light reflecting film. For reflecting light, the third negative electrode 274 preferably includes Ag. In the second embodiment, the first light emitting structure 210 emits blue light, the second light emitting structure 220 emits green light, and the third light emitting structure 250 emits red light. For example, blue light may be absorbed in the third light emitting structure 250. Therefore, the generated light needs to be emitted toward the substrate 201. For this, a third negative electrode 274 having a light reflection function needs to substantially cover the third n-type semiconductor layer 253.

FIGS. 16 to 19 are views for explaining a method of manufacturing an LED according to a second embodiment of the present inventive concept.

Figure 16:
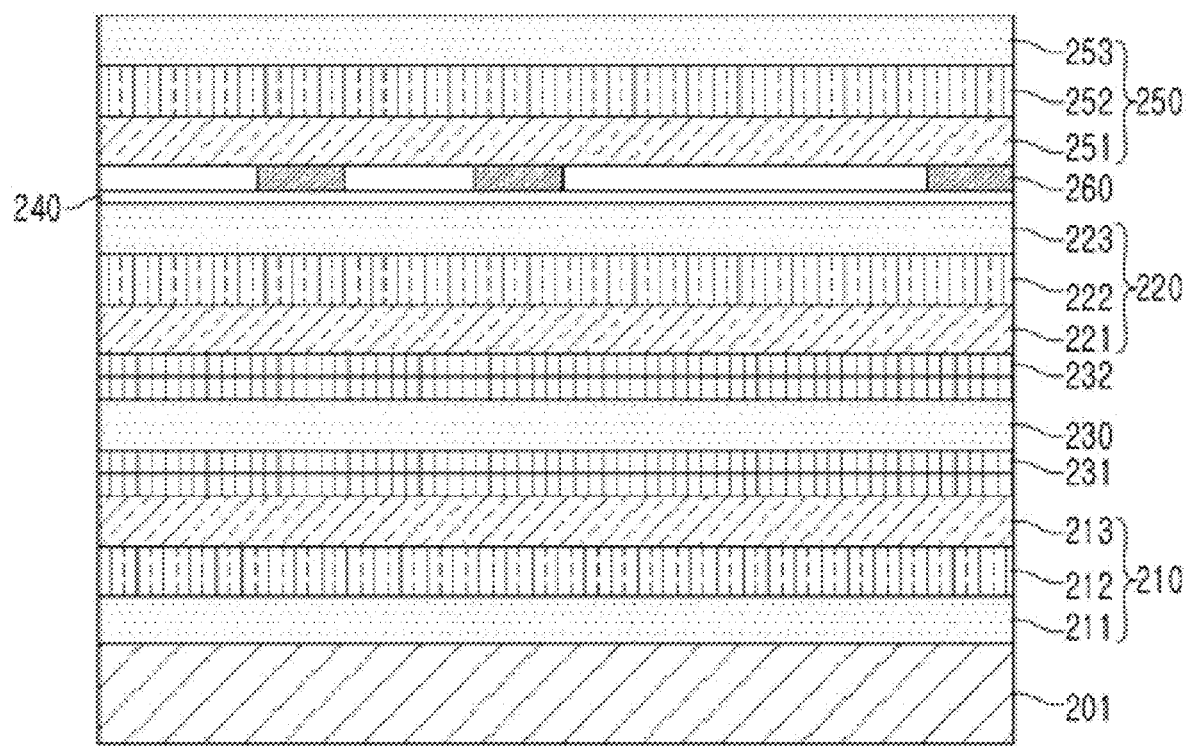
FIGS. 16 to 19 are views for explaining a method of manufacturing an LED according to a second embodiment of the present inventive concept.

Referring to FIG. 16, the first light emitting structure 210, the second light emitting structure 220, the first tunnel junction layer 231, the common current spreading layer 230, the second tunnel junction layer 232, the second light emitting structure 220, the insulating layer 240, the metal bonding layer 260, and the third light emitting structure 250 are sequentially formed. The third light emitting structure 250 grown through a separate epitaxial process as in the first embodiment is formed on the insulating layer 240 by being stacked on the metal bonding layer 260.

Also, the first tunnel junction layer 231 may be formed only of a $p^{++}$-GaN layer, or may be formed of a $p^{++}$-GaN layer and an $n^{++}$-GaN layer which are sequentially grown away from the substrate, or may be a repeating structure thereof. Also, the second tunnel junction layer 232 may be formed only of a $p^{++}$-GaN layer, and may be formed of an $n^{++}$-GaN layer and a $p^{++}$-GaN layer sequentially grown upward, or may be a repeating structure thereof.

For example, the substrate 201 may be sapphire, and the first light emitting structure 210 and the second light emitting structure 220 are formed on the sapphire substrate by using an MOCVD process. The first light emitting structure 210 and the second light emitting structure 220 may be formed by a continuing process in the same growth chamber, or the second light emitting structure 220 may be formed by a regrowth process in a separate growth chamber. After the second light emitting structure 220 is formed, the insulating layer 240 is deposited on the uppermost layer of the second light emitting structure 220.

Separately, a third n-type semiconductor layer 253, a third active layer 252 and a third p-type semiconductor layer 251 are sequentially deposited on another substrate (for example, a GaAs substrate). Thereafter, a metal bonding layer 260 is formed on the insulating layer 240, and the metal bonding layer 260 formed on the third light emitting structure is bonded to the second light emitting structure 220 through eutectic bonding. Finally, when the GaAs substrate is removed using an acid solution, the structure of FIG. 16 can be obtained.

A method different from the bonding method previously described can be used. That is, the insulating layer 240 and the metal bonding layer 260 may be formed on the third p-type semiconductor layer 251 which is the uppermost layer on the GaAs substrate in a state in which the structure on the sapphire substrate and the structure on the GaAs substrate are separated from each other. Further, the metal bonding layer 260 may be bonded to the second n-type semiconductor layer 223 which is the uppermost layer formed on the sapphire substrate. Accordingly, the structure in which the positions of the insulating layer 240 and the metal bonding layer 260 are exchanged may be formed, as compared with the structure shown in FIG. 16.

Figure 17:
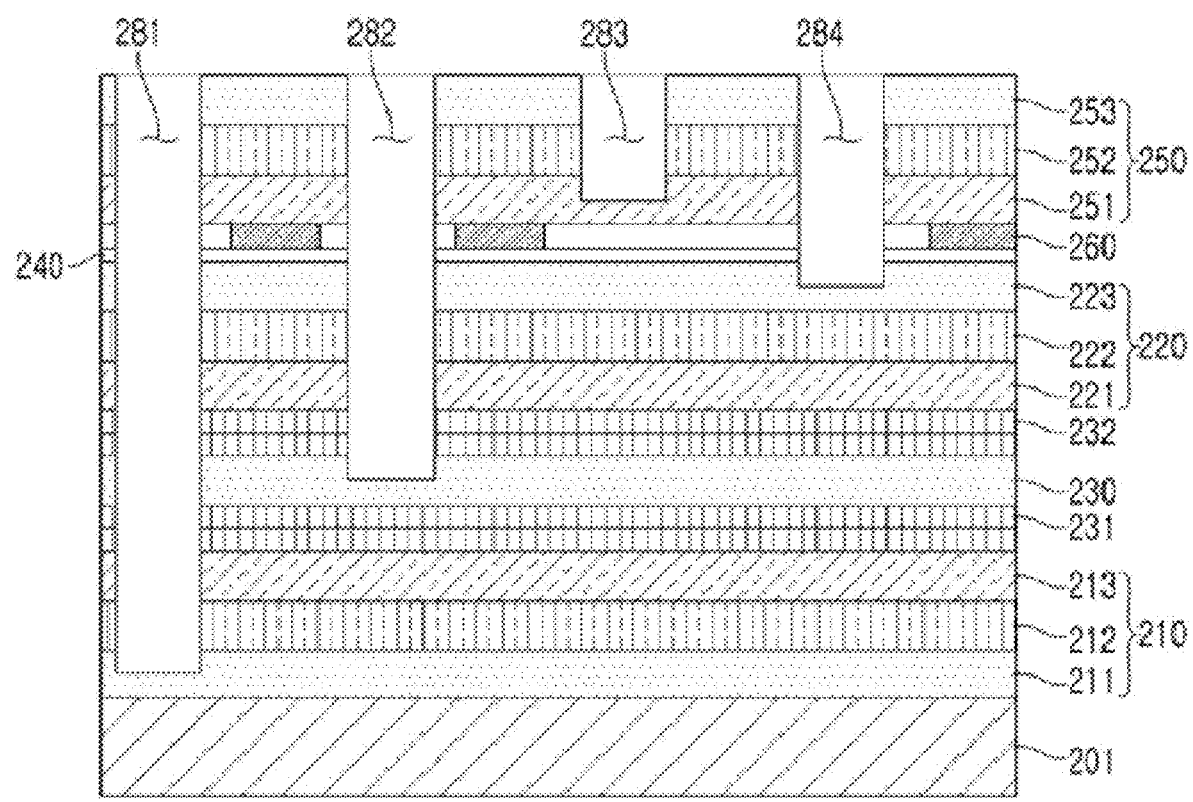

Referring to FIG. 17, contact holes 281, 282, 283, and 284 for fabricating electrodes may be formed in the stacked light emitting structures. The contact holes 281, 282, 283, and 284 may be formed through etching by using a photoresist and the like, for example. The first contact hole 281 may be formed up to the first n-type semiconductor layer 211 so that the bottom of the hole is in contact with the first n-type semiconductor layer 211, the second contact hole 282 may formed up to the common current spreading layer 230, the third contact hole 283 may extend to the third p-type semiconductor layer 251, and the fourth contact hole 284 may extend to the second n-type semiconductor layer 223.

Figure 18:
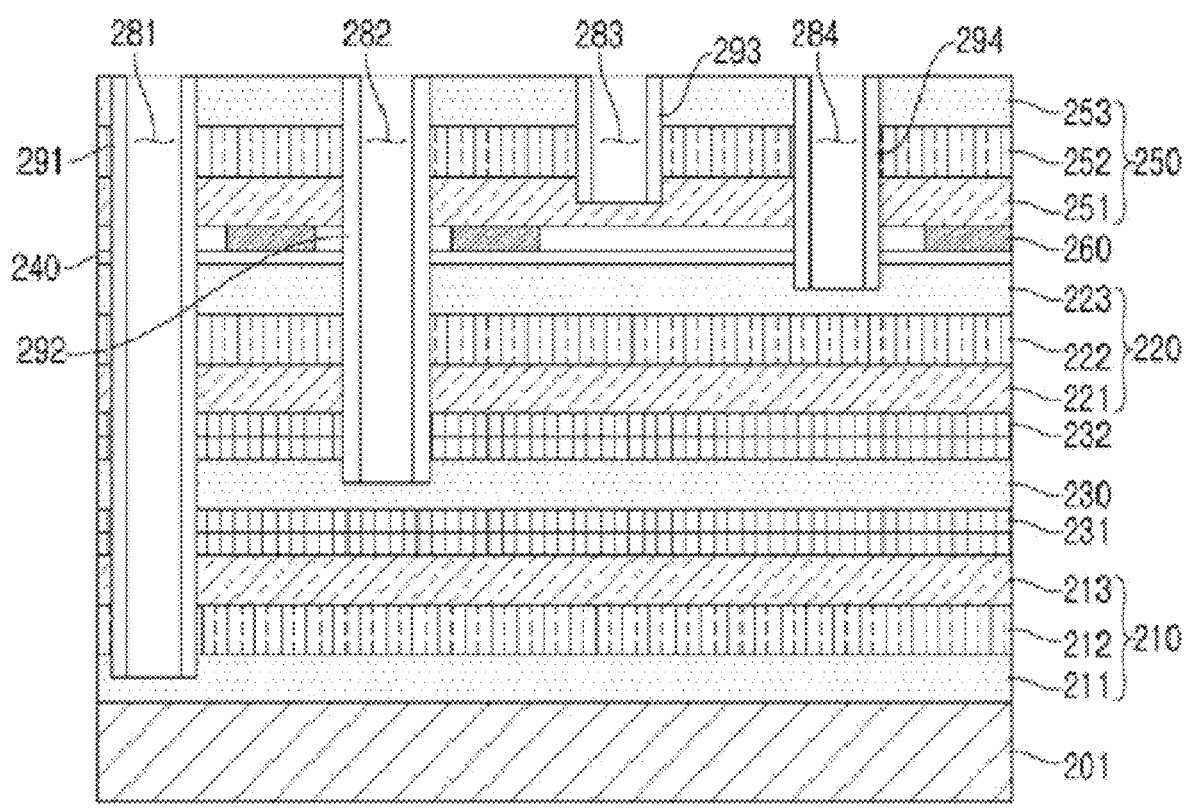

Referring to FIG. 18, insulating films 291, 292, 293, 294 may be formed in the respective contact holes 281, 282, 283, 284. As for the material for the insulating films 291, 292, 293, and 294, for example, an insulating material such as SiO2 may be used and may be formed on the side surfaces in the contact holes 281, 282, 283, and 284 by using an etch-back process and the like.

That is, after the contact holes 291, 292, 293, and 294 are formed, the insulating film is conformally formed, and then the etch-back process proceeds to expose the surface of the third n-type semiconductor layer 253 in the uppermost layer, a part of the first n-type semiconductor layer 211, the common current spreading layer 230 and the second n-type semiconductor layer 223 which are connected to the bottoms of contact holes 291, 292, 293, and 294 are exposed. Further, the insulating films remain on the side surfaces of each of the contact holes 291, 292, 293, and 294.

Figure 19:
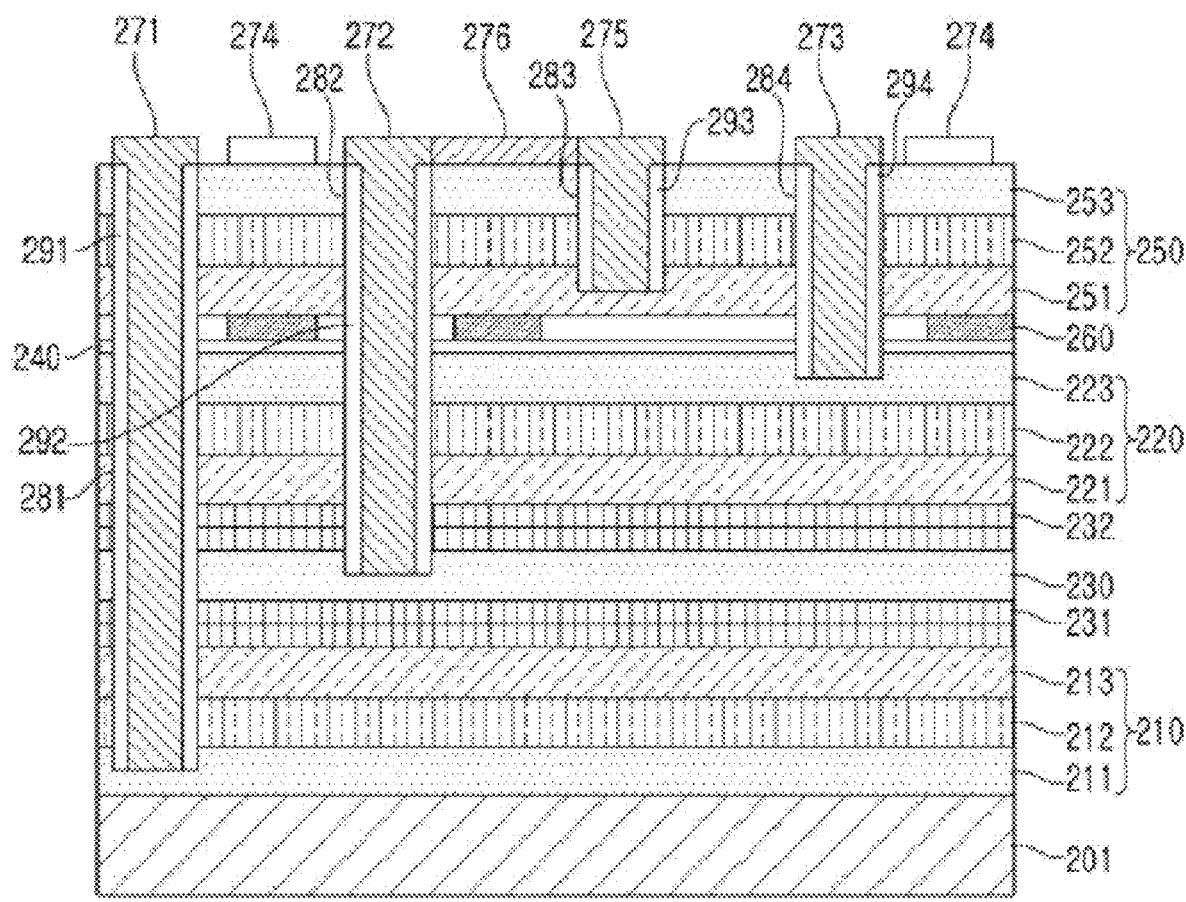

Referring to FIG. 19, metal electrodes may be formed in each of the contact holes 281, 282, 283, 284 within which the insulating films 291, 292, 293, 294 are in place. That is, the metal electrodes may extend to the corresponding layer to which the respective metal electrodes are making electrical contacts. The first negative electrode 271 may be electrically connected to the first n-type semiconductor layer 211 of the first light emitting structure 210, and the first positive electrode 272 may be electrically connected to the common current spreading layer 230. The second positive electrode 275 may be electrically connected to the third p-type semiconductor layer 251 of the third light emitting structure 250, and the second negative electrode 273 may be electrically connected to the second n-type semiconductor layer 223.

A third negative electrode 274 connected to the third n-type semiconductor layer 253 of the third light emitting structure 250 may be formed on the third n-type semiconductor layer 253, and the first positive electrode 272 and the second positive electrode 275 may be electrically connected to each other by using the conductive layer 276. Contrary to the first embodiment, the metal contacts are disposed on the upper surface of the LED, thereby improving the flatness of the metal contacts in the second embodiment.

As described above, the LED according to the present inventive concept adopts a method of stacking separately formed light emitting structure grown on different substrates by using the eutectic bonding, instead of sequentially depositing the conventional light emitting structure. Therefore, it is possible to prevent crystal defects occurring between the light emitting structures when the same structures are sequentially deposited or grown epitaxially.

That is, since the first and second light emitting structures emit blue light and green light, respectively, the two light emitting structures can be grown using a GaN-based epitaxial growth method. However, since the third light emitting structure needs to emit red light, the active layer in the third LED is prone to have a high density of defects due to high In content when GaN-based epitaxial growth is employed. Therefore, it is highly desirable to have a third light emitting structure formed on a separate substrate that is free of those defects in the active layer, e.g., a red AlInGaP LED wafer on a GaAs substrate, and the third light emitting structure can be bonded to the above-mentioned second light emitting structure through appropriate means. When the third light emitting structure is bonded to the second light emitting structure by using the eutectic bonding according to the present inventive concept, three light emitting structures generating three colors can be vertically stacked.

Further, in order to facilitate extraction of light, the electrodes are formed at corner positions. Since the positive electrodes of the vertically stacked structure constitute a common terminal, brightness of light generated from each light emitting structure is individually adjusted through adjustment of the voltage or current at each negative electrode. Accordingly, vertically stacked LEDs with a footprint of just one conventional LED can realize various colors and be used as a single pixel, different and improved from using sub pixels in a conventional microdisplay.

In a conventional microdisplay, one sub-pixel has a diameter of at least about 10 um or somewhat less. The three sub-pixels are horizontally arranged to form a unit pixel of about 50 um in size. However, according to the present inventive concept, three light emitting structures are vertically stacked, and one pixel is composed of vertically stacked LEDS having a footprint of one LED. Therefore, a single pixel with a diameter much less than 50 um can be easily formed.

Further, since the eutectic metal alloy can be formed in various patterns, it is possible to control and optimize the adhesive strength, transmittance of the light generated in the upper light emitting structure, and resistance. Furthermore, the flatness of the metal electrodes can be improved by forming the metal electrodes to extend from the upper surface of the LED to the layer to which the metal electrodes are connected so that the electrodes are all disposed on the upper surface of the LED. Therefore, when the LED is mounted on an electronic device and the like, operating efficiency is improved.

It should be noted that the embodiments disclosed in the present specification and drawings are only illustrative of specific examples for the purpose of understanding and are not intended to limit the scope of the present inventive concept. It will be apparent to those skilled in the art that other modifications based on the technical idea of the present inventive concept are possible in addition to the embodiments disclosed herein.

The invention claimed is:

1. A multi-junction LED using eutectic bonding comprising:
   a first light emitting structure formed on a substrate;
   a second light emitting structure formed on the first light emitting structure;
   a common current spreading layer formed between the first light emitting structure and the second light emitting structure;
   an insulating layer formed on the second light emitting structure;
   a third light emitting structure formed on the insulating layer; and
   a metal bonding layer formed between the third light emitting structure and the insulating layer to bond the third light emitting structure to the insulating layer by using eutectic bonding,
   wherein the first light emitting structure has a first n-type semiconductor layer, a first active layer and a first p-type semiconductor layer that are sequentially deposited, wherein the second light emitting structure has a second p-type semiconductor layer, a second active layer and a second n-type semiconductor layer that are sequentially deposited, wherein the third light emitting structure has a third p-type semiconductor layer, a third active layer and a third n-type semiconductor layer that are sequentially deposited, and
   wherein the LED has a first mesa structure in which upper layers of the first n-type semiconductor layer are removed to expose a part of an upper surface of the first n-type semiconductor layer, and a second mesa structure in which upper layers of the common current spreading layer are removed to expose a part of an upper surface of the common current spreading layer,
   wherein a first negative electrode is formed on an upper surface the first n-type semiconductor layer exposed by the first mesa structure, a first positive electrode is formed on an upper surface of the common current spreading layer exposed by the second mesa structure, a second negative electrode is formed on the third n type semiconductor layer, and a second positive electrode is formed on the insulating layer and electrically connected to the metal bonding layer.

2. The multi-junction LED of claim 1, wherein the metal bonding layer has a eutectic metal alloy.

3. The multi-junction LED of claim 2, wherein the eutectic metal alloy has Au—Ge alloy or Au—Sn alloy.

4. The multi-junction LED of claim 3, wherein the Au in the Au—Ge alloy has a weight ratio ranging from 65 wt % to 80 wt %.

5. The multi-junction LED of claim 3, wherein the Au in the Au—Sn alloy has weight ratio ranging from 70 wt % to 90 wt %.

6. The multi-junction LED of claim 1, wherein the metal bonding layer is formed on the insulating layer and has a shape in which one end and the other end of a line forming a rectangle are close to or in contact with each other.

7. The multi-junction LED of claim 6, wherein the interior of the rectangle shape of the metal bonding layer is hollow.

8. The multi-junction LED of claim 6, wherein the interior of the rectangle shape of the metal bonding layer is filled with a lattice pattern.

9. The multi-junction LED of claim 6, wherein the interior of the rectangle shape of the metal bonding layer is filled with isolated dots spaced apart from each other.

10. The multi-junction LED of claim 1, further comprising:
    a first tunnel junction layer formed between the common current spreading layer and the first light emitting structure; and
    a second tunnel junction layer formed between the common current spreading layer and the second light emitting structure.

11. The multi-junction LED of claim 1, wherein the second positive electrode is of the same material as the metal bonding layer.

12. The multi-junction LED of claim 1, further comprising:
    a conductive layer for electrically connecting the first positive electrode and the second positive electrode.

13. The multi-junction LED of claim 1, wherein the first negative electrode, the first positive electrode, the second negative electrode, and the second positive electrode are formed at edges of the LED, respectively.

14. The multi-junction LED of claim 1, wherein the first light emitting structure emits blue light, the second light emitting structure emits green light, and third light emitting structure emits red light.

15. A multi-junction LED using eutectic bonding comprising:
    a first light emitting structure formed on a substrate;
    a second light emitting structure formed on the first light emitting structure;
    a common current spreading layer formed between the first light emitting structure and the second light emitting structure;
    an insulating layer formed on the second light emitting structure;
    a third light emitting structure formed on the insulating layer; and
    a metal bonding layer formed between the third light emitting structure and the insulating layer to bond the third light emitting structure to the insulating layer by using eutectic bonding,
    wherein the first light emitting structure has a first n-type semiconductor layer, a first active layer and a first p-type semiconductor layer that are sequentially deposited, wherein the second light emitting structure has a second p-type semiconductor layer, a second active layer and a second n-type semiconductor layer that are sequentially deposited, wherein the third light emitting structure has a third p-type semiconductor layer, a third active layer and a third n-type semiconductor layer that are sequentially deposited, wherein a first negative electrode is formed on the third light emitting structure and extended to the first n-type semiconductor layer, a first positive electrode is formed on the third light emitting structure and extended to the common current spreading layer, a second negative electrode is formed on the third light emitting structure and extended to the second n-type semiconductor layer, a third negative electrode is formed on the third light emitting structure, and a second positive electrode is formed on the third light emitting structure and extended to the third p-type semiconductor layer.

16. The multi-junction LED of claim 15, further comprising:

a conductive layer formed on the third light emitting structure and electrically connecting the first positive electrode and the second positive electrode.

17. The multi-junction LED of claim 15, wherein the metal bonding layer is formed on the insulating layer and has a shape in which one end and the other end of a line forming a rectangle are close to or in contact with each other.

18. The multi-junction LED of claim 17, wherein the interior of the rectangle shape of the metal bonding layer is hollow.

19. The multi-junction LED of claim 17, wherein the interior of the rectangle shape of the metal bonding layer is filled with a lattice pattern.

20. The multi-junction LED of claim 17, wherein the interior of the rectangle shape of the metal bonding layer is filled with isolated dots spaced apart from each other.

* * * * *